(12) United States Patent
Membretti et al.

(10) Patent No.: US 9,160,223 B2
(45) Date of Patent: Oct. 13, 2015

(54) RECTIFIER CIRCUIT, AND ENVIRONMENTAL ENERGY HARVESTING SYSTEM COMPRISING THE RECTIFIER CIRCUIT

(75) Inventors: Giorgio Massimiliano Membretti, Milan (IT); Alessandro Gasparini, Cusano Milanino (IT); Stefano Ramorini, Arluno (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 721 days.

(21) Appl. No.: 13/456,725

(22) Filed: Apr. 26, 2012

(65) Prior Publication Data

US 2012/0274132 A1 Nov. 1, 2012

(30) Foreign Application Priority Data

Apr. 29, 2011 (IT) ................ TO2011A0378

(51) Int. Cl.
| | |
|---|---|
| *B60L 1/00* | (2006.01) |
| *H02M 7/04* | (2006.01) |
| *H02M 1/08* | (2006.01) |
| *H02M 7/219* | (2006.01) |
| *H03K 17/06* | (2006.01) |
| *H03K 17/22* | (2006.01) |

(52) U.S. Cl.
CPC ............. *H02M 1/08* (2013.01); *H02M 7/219* (2013.01); *H03K 17/063* (2013.01); *H03K 17/223* (2013.01)

(58) Field of Classification Search
CPC combination set(s) only.
See application file for complete search history.

(56) References Cited

U.S. PATENT DOCUMENTS

| | | |
|---|---|---|
| 5,617,015 A | 4/1997 | Goder et al. |
| 7,105,982 B1 | 9/2006 | Hagood, IV et al. |
| 7,132,765 B2 | 11/2006 | Premont et al. |
| 7,193,401 B1 | 3/2007 | Hasegawa |
| RE43,291 E | 4/2012 | Groom |
| 2005/0007178 A1 | 1/2005 | Fahim |
| 2005/0110277 A1 | 5/2005 | Adamson et al. |
| 2005/0218877 A1 | 10/2005 | Oswald et al. |
| 2006/0237968 A1 | 10/2006 | Chandrasekaran |
| 2007/0159150 A1 | 7/2007 | Hosokawa et al. |

(Continued)

FOREIGN PATENT DOCUMENTS

WO WO-2007040536 A2 4/2007

OTHER PUBLICATIONS

Lee S. et al: "Robust and Efficient Synchronous Buck Converter With Near-Optimal Dead-Time Control," IEEE International Solid-State Circuits Conference, Feb. 2011.

(Continued)

*Primary Examiner* — Jared Fureman
*Assistant Examiner* — Aqeel Bukhari
(74) *Attorney, Agent, or Firm* — Gardere Wynne Sewell LLP

(57) ABSTRACT

A rectifier circuit includes a first, second, third and fourth parasitic diodes electrically connected to form a full-wave diode-bridge rectifier. A first switch and a second switch are connected in parallel, respectively, to the first and second parasitic diodes, and a third switch and a fourth switch connected in parallel, respectively, to the third and fourth parasitic diodes. A first biasing network is configured to drive in conduction the first and second switches, during turning-on of the rectifier circuit, using a first turning-on signal that is a function of the input signal. A second biasing network is configured to close the third and fourth switches, during turning-on of the rectifier circuit, using a second turning-on signal that is a function of the input signal.

28 Claims, 6 Drawing Sheets

(56) References Cited

U.S. PATENT DOCUMENTS

| | | | |
|---|---|---|---|
| 2008/0129144 A1* | 6/2008 | Bechhoefer | 310/313 D |
| 2009/0322303 A1 | 12/2009 | Hirata et al. | |
| 2010/0165686 A1* | 7/2010 | Matzberger et al. | 363/127 |
| 2010/0301122 A1* | 12/2010 | Russell et al. | 235/492 |
| 2012/0235976 A1 | 9/2012 | Van Lier | |

OTHER PUBLICATIONS

EPO Search Report for EP12162776.4 mailed Jul. 27, 2012 (7 pages).

Dwari, Suman et al: "An Efficient AC-DC Step-Up Converter for Low-Voltage Energy Harvesting," IEEE Transactions on Power Electronics, vol. 25, No. 8, Aug. 2010, pp. 2188-2199.

Belloni M et al: "On the Design of Single-Inductor Multiple-Output DC-DC Buck Converters," Circuits and Systems, 2008, ISCAS 2008, IEEE International Symposium on, IEEE, Piscataway, NJ, US, May 18, 2008, pp. 3049-3052.

IT Search Report and Written Opinion for IT TO2011A000378 mailed Jan. 4, 2012 (7 pages).

Ma D et al: "A Pseudo-CCM/DCM Simo Switching Converter With Freewheel Switching," IEEE Journal of Solid-State Circuits, IEEE Service Center, Piscataway, NJ, US, vol. 38, No. 6, Jun. 1, 2003, pp. 1007-1014.

Seeman M D et al: "An Ultra-Low-Power Power Management IC for Energy-Scavenged Wireless Sensor Nodes," Power Electronics Specialists Conference, 2008, PESC 2008, IEEE, Piscataway, NJ, US, Jun. 15, 2008, pp. 925-931.

Seeman M D et al: "An Ultra-Low-Power Power Management IC for Wireless Sensor Nodes," Custom Integrated Circuits Conference, 2007, CICC '07, IEEE, Piscataway, NJ, US, Sep. 16, 2007, pp. 567-570.

Shenck N S et al: "Energy Scavenging with Shoe-Mounted Piezoelectrics," IEEE Micro, IEEE Service Center, Los Alamitos, CA, US, vol. 21, No. 3, May 1, 2001, pp. 30-42.

Wing-Hung Ki et al: "Single-Inductor Multiple-Output Switching Converters," 32nd Annual IEEE Power Electronics Specialists Conference, PESC 2001. Conference Proceedings, Vancouver, CA, Jun. 17-21, 2001, pp. 226-231.

Maxim Integrated Products: MAXIM Dual Mode 5V/Programmable Micropower Voltage Regulators (MAX663/MAX664/MAX666) Spec Sheet; Rev 1; Jul. 1996; pp. 1-8.

* cited by examiner

RECTIFIER CIRCUIT, AND ENVIRONMENTAL ENERGY HARVESTING SYSTEM COMPRISING THE RECTIFIER CIRCUIT

PRIORITY CLAIM

This application claims priority from Italian Application for Patent No. TO2011A000378 filed Apr. 29, 2011, the disclosure of which is hereby incorporated by reference.

TECHNICAL FIELD

The present invention relates to a rectifier circuit, in particular adapted to operate with low input voltages. The present invention moreover relates to an environmental energy harvesting system comprising the rectifier circuit, and a vehicle comprising said environmental energy harvesting system.

BACKGROUND

As is known, energy harvesting systems (also known as energy-scavenging systems) for harvesting energy from intermittent environmental energy sources (i.e., ones that supply energy in an irregular way) have aroused and continue to arouse considerable interest in a wide range of technological fields. Typically, the energy harvesting systems are designed to harvest, store, and transfer energy generated by mechanical sources to a generic load of an electrical type.

Low-frequency vibrations, such as for example mechanical vibrations of disturbance in systems with moving parts, can be a valid energy source.

The mechanical energy is converted, by one or more appropriate transducers (for example, piezoelectric or electromagnetic devices) into electrical energy, which can be used for supplying an electrical load. In this way, the electrical load does not require batteries or other supply systems that are cumbersome and have a low resistance to mechanical stresses.

FIG. 1 is a schematic illustration, by means of functional blocks, of an energy harvesting system of a known type.

The energy harvesting system 1 of FIG. 1 comprises: a transducer 2, for example of an electromagnetic or piezoelectric type, subject during use to environmental mechanical vibrations and configured for converting mechanical energy into electrical energy, typically into AC voltages; a scavenging interface 4, for example comprising a diode-bridge rectifier circuit, configured for receiving at input the AC signal generated by the transducer 2 and supplying at output a DC signal for charging a capacitor 5 connected to the output of the rectifier circuit 4; and a DC-DC converter 6, connected to the capacitor 5 for receiving at input the electrical energy stored by the capacitor 5 and supplying it to an electrical load 8. The capacitor 5 hence has the function of element for storage of energy, which is made available, when required, to the electrical load 8 for operation of the latter.

The rectifier 4 comprises, in the embodiment of FIG. 1, a diode bridge comprising four Schottky diodes 4a, 4b, 4c, 4d. The minimum voltage $V_{IN}$ at input to the rectifier 4 of FIG. 4 for a rectified output voltage $V_{OUT}$ to be generated is given by $V_{IN} > 2V_D$, where $V_D$ is the threshold voltage of each Schottky diode. When the input voltage $V_{IN}$ is lower than the minimum voltage required at input by the rectifier 4 for its operation, the rectifier 4 is in a blocked state and does not produce an output voltage $V_{OUT}$.

When the input voltage $V_{IN}$ equals the value $2V_D$, the rectifier 4 conducts, and a charge appears on the capacitor 5, which is charged. It is evident that for voltages $V_{IN}$ at input to the rectifier 4 lower than the threshold $2V_D$ the capacitor 5 is not charged, and the environmental energy converted by the transducer 2 into electrical energy is dispersed.

It should be noted that the Schottky-diode bridge rectifier can, under certain operating conditions, guarantee an output $V_{OUT}$ also at low input voltages $V_{IN}$ (lower than 1 V). However, this is valid only for low current densities (typically less than 10 mA). In energy harvesting systems the currents generated can vary a lot in time, and can assume very low values as well as very high (peak) values, in an unforeseeable way.

A rectifier 4 of the type illustrated in FIG. 1 consequently does not guarantee a sufficient continuity of operation in different operating conditions. Moreover, Schottky diodes have a response markedly depending upon the temperature, which limits their use to controlled-temperature environments.

FIG. 2 shows an energy harvesting circuit 10 of a known type according to a further embodiment.

Unlike the system of FIG. 1, the system 10 of FIG. 2 comprises a rectifier 14 of a magnetic type.

The magnetic rectifier 14 comprises a transformer 16, including two primary windings 16a, 16b and a secondary winding 16c. The coupling factor m is chosen greater than 1. The energy harvesting system 10 further comprises a diode 12 connected in series to the secondary winding 16c.

Moreover, each primary winding 16a, 16b is set in series to a respective unidirectional switch 15a, 15b. When the voltage $V_{IN}$ is maximum, the switch 15a is closed and the capacitor 5 is charged. When the voltage $V_{IN}$ is minimum the switch 15b is closed and the capacitor 5 is discharged.

The equivalent threshold voltage of the system, fed back to the input, transducer 2 side, is thus equal to the voltage $V_D$ of the diode 12 scaled by the factor "m".

Hence, as compared to the system 1 of FIG. 1, in which the threshold of the rectifier 4 is fixed at $2V_D$, the system 10 of FIG. 2 enables storage of energy in the capacitor 5 starting from lower input voltages $V_{IN}$. However, this embodiment is particularly costly on account of the use of magnetic elements. Moreover, since said system cannot be easily built in an integrated form, the consumption of area is high.

There is a need in the art to provide an improved rectifier circuit and an environmental energy harvesting system comprising the rectifier circuit that will enable the aforesaid problems and disadvantages to be overcome.

SUMMARY

A rectifier circuit according to an embodiment of a rectifier circuit and an environmental energy harvesting system is of an integrated type that is able to operate with low input voltages.

In particular, according to an implementation a rectifier circuit is provided, which can be connected between an input signal source (in particular, an AC voltage signal) and an electrical load, for supplying a DC output signal (in particular a DC voltage signal) to the load. The rectifier circuit comprises: four diodes electrically connected to one another to form a diode-bridge rectifier; four switches (in particular transistors, more in particular MOSFETs), each of which is connected in parallel to a respective diode of the diode bridge and has a control terminal; a first biasing network coupled to the control terminals of two switches set on adjacent branches of the bridge; and a second biasing network coupled to the control terminals of the remaining two switches. The first biasing network is configured for driving in conduction the respective switches during a positive half-wave of the AC input signal, whilst the second biasing network is configured for driving in conduction the remaining two switches during a negative half-wave of the AC input signal so as to generate the rectified DC output signal.

BRIEF DESCRIPTION OF THE DRAWINGS

For a better understanding of the present invention, preferred embodiments thereof are now described, purely by way of non-limiting example and with reference to the attached plates of drawings, wherein.

DETAILED DESCRIPTION OF THE DRAWINGS

Figure 1:
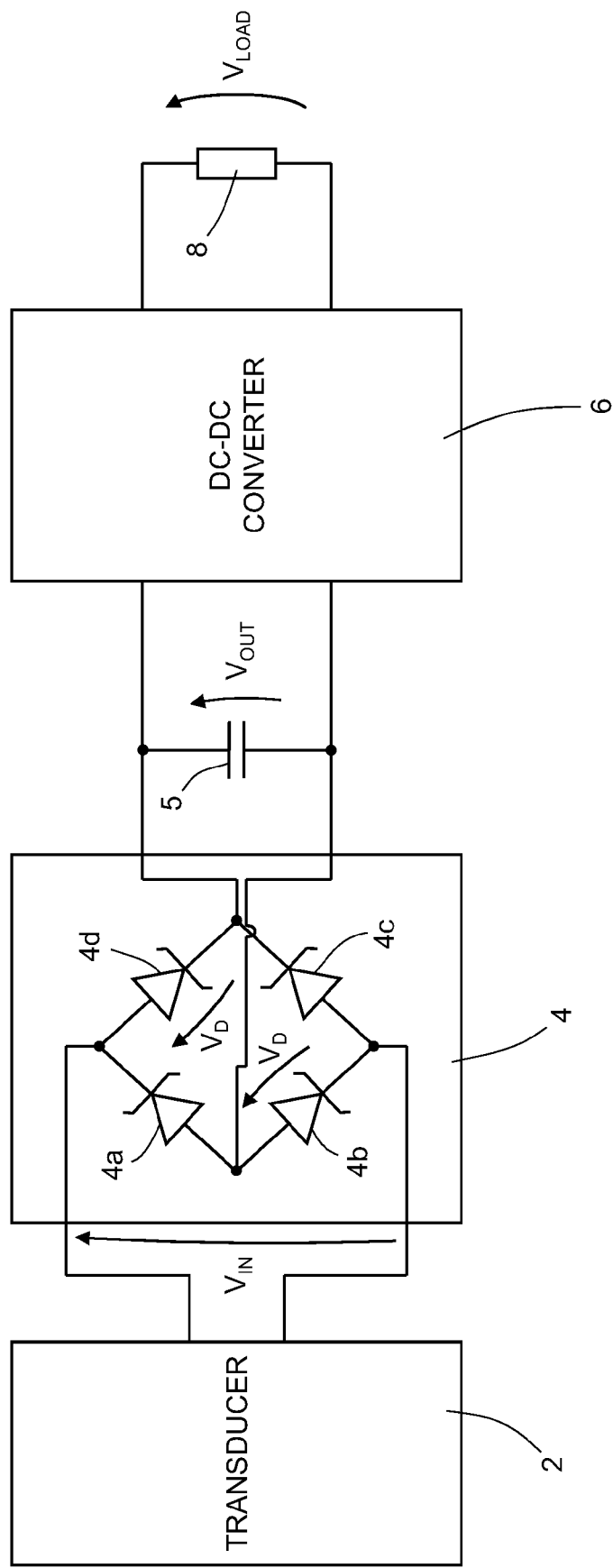
FIG. 1 shows an energy harvesting system according to a known embodiment.
Figure 2:
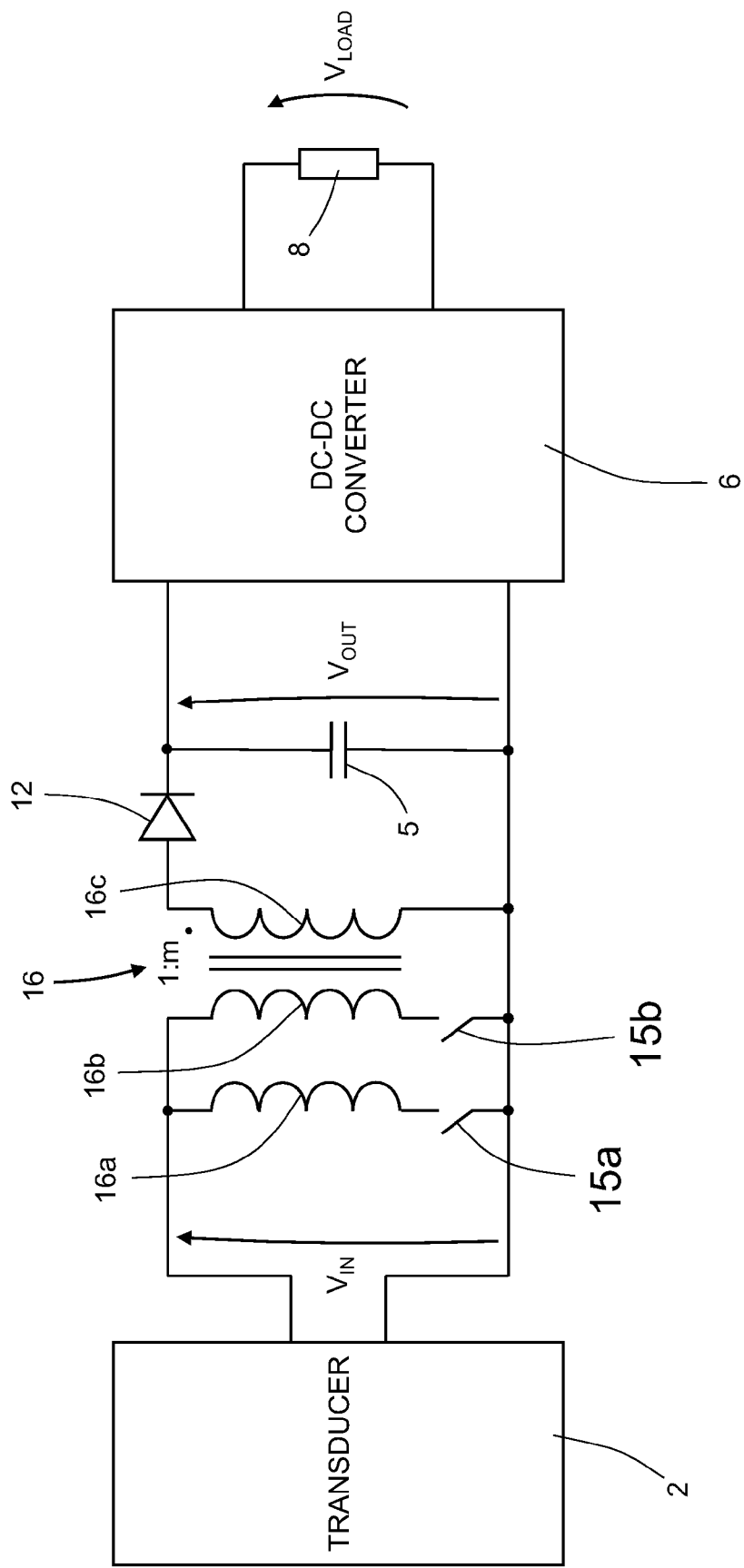
FIG. 2 shows an energy harvesting system according to a further known embodiment.

The rectifier circuit according to an embodiment presented herein can be connected between an input signal source (in particular, an AC voltage signal) and an electrical load, for supplying an output signal to the load (in particular a rectified signal, which can be approximated as DC voltage signal). The rectifier circuit comprises, according to one embodiment: two diodes electrically connected to one another to form a diode rectifier, and two switches each of which is connected in parallel to a respective diode and has a control terminal; and a first biasing network coupled to the control terminals of the two switches. The first biasing network is configured for driving in conduction, during a step of turning-on of the rectifier circuit, the first and second switches by means of a first turning-on signal that is a function of the input signal, so as to generate, at output from the rectifier circuit, a rectified output signal.

In a further embodiment of the rectifier circuit, the rectifier circuit comprises: a further two diodes, for a total of four diodes, electrically connected to one another to form a diode-bridge rectifier, also known as "Graetz bridge"; and a further two switches, for a total of four switches, each of which is connected in parallel to a respective diode of the diode bridge and has a control terminal. Moreover, the rectifier circuit comprises a second biasing network. In this case, the first biasing network is coupled to the control terminals of two switches set on opposite branches of the diode bridge, whereas the second biasing network is coupled to the control terminals of the remaining two switches.

In the initial step of turning-on of the rectifier circuit, the first biasing network is configured for driving in conduction the respective switches during a positive half-wave of the input signal, whereas the second biasing network is configured for driving in conduction the remaining two switches during a negative half-wave of the input signal so as to generate the rectified output signal.

In greater detail, the rectifier circuit comprises a first input terminal and a second input terminal, which are configured for receiving the input signal, and a first output terminal and a second output terminal, which can be connected to the load. A first switch and a first diode are connected between the first input terminal and the second output terminal; and a second switch and a second diode are connected between the second input terminal and the first output terminal. A two-diode rectifier is thus formed.

In addition, it is possible to provide the rectifier circuit with a further two diodes to form the full-wave diode-bridge rectifier. In this case, a third switch and a third diode are connected between the second output terminal and the second input terminal; and a fourth switch and a fourth diode are connected between the first input terminal and the first output terminal.

In particular, according to one embodiment, the switches (whether in the case of a two-diode rectifier or in the case of a four-diode rectifier) are transistors (even more in particular MOSFETs), and the diodes are the diodes integrated in said transistors.

Coupled on the output of the rectifier circuit is a capacitor, for storing electrical charge.

Once the turning-on step has terminated (i.e., the output voltage exceeds a minimum threshold), the first and second biasing networks are disabled, and the rectifier circuit operates in a known way, as a rectifier circuit of a known type in which the transistors are appropriately driven for generating the desired output signal.

The rectifier circuit according to the present invention is described in detail with reference to a preferred application thereof, in particular as rectifier circuit of an energy harvesting system, designed to operate as scavenging interface between an AC-voltage source and an energy-storage element.

Figure 3:
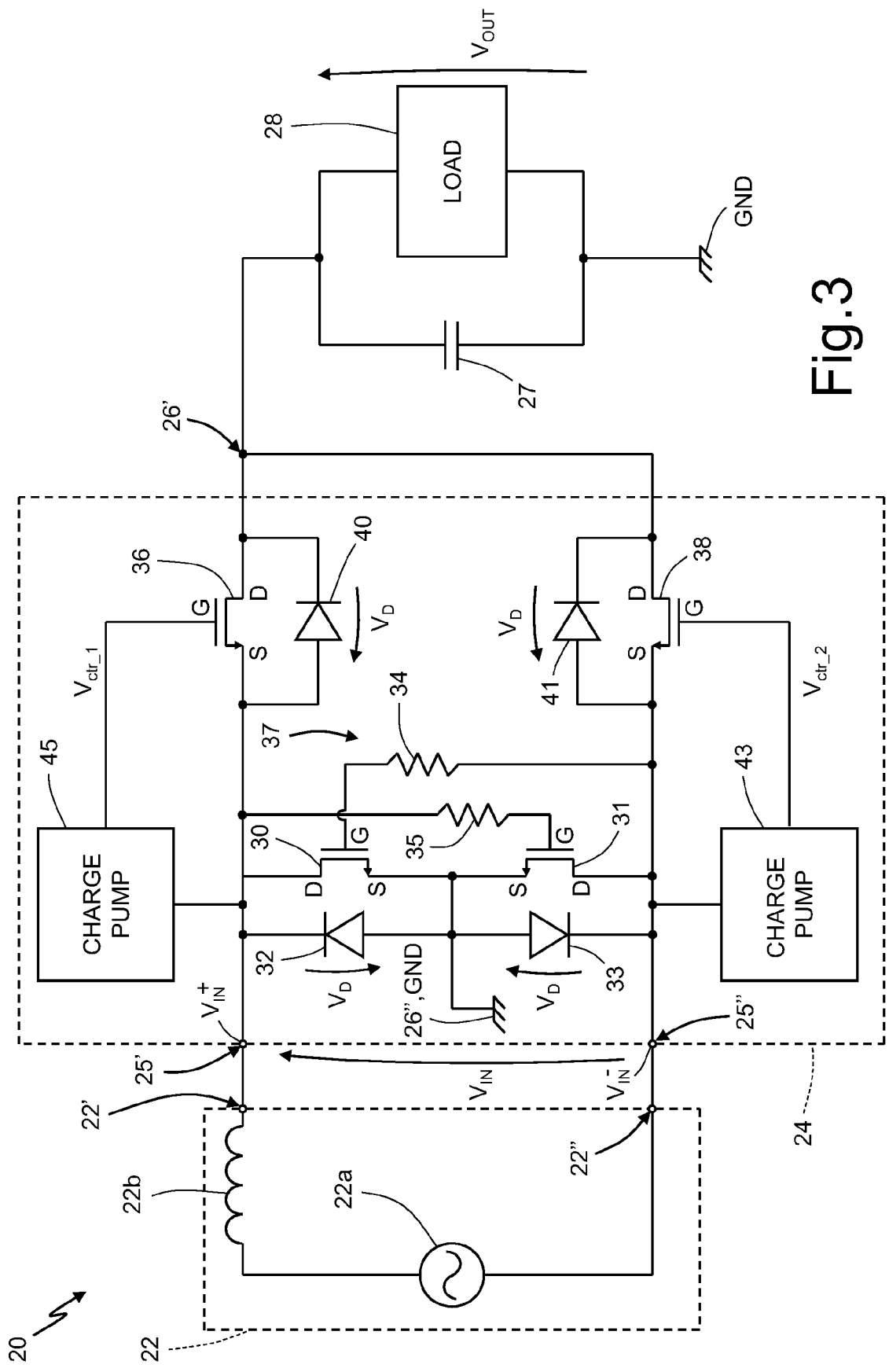
FIG. 3 shows an energy harvesting system comprising a rectifier circuit provided with biasing means according to one embodiment of the present invention.

FIG. 3 shows an energy harvesting system 20 comprising a rectifier circuit 24 according to one embodiment of the present invention.

In general, the energy harvesting system 20 comprises: a transducer 22 (represented schematically, in FIG. 3, as a voltage generator 22a with an inductor 22b connected in series to one another) including output terminals 22', 22" of its own, the rectifier circuit 24 (forming a scavenging interface of the energy harvesting system 20) including a first input terminal and a second input terminal 25', 25", electrically coupled, respectively, to the output terminals 22', 22" of the transducer 22, and a first output terminal and a second output terminal 26', 26"; and a storage element 27, for example a capacitor, connected between the first and second output terminals 26', 26" of the rectifier circuit 24, and configured for storing electrical charge supplied at output by the rectifier circuit 24.

According to one embodiment, the second output terminal 26" is a terminal at reference voltage, for instance at ground voltage GND, for example at approximately 0 V.

On the output of the rectifier circuit 24, in parallel to the storage element 27, an electrical load 28 can be connected, designed to be supplied by the charge stored in the storage element 27. Between the storage element 27 and the electrical load 28 there may moreover be present a DC-DC converter (in a way similar to what has been illustrated in FIG. 1 and described with reference to said figure).

Connected between the first input terminal 25' and the second output terminal 26" of the rectifier circuit 24 is a first switch 30, in particular of a voltage-controlled type. The first switch 30 is, for example, a MOSFET of an n type. Connected between the second input terminal 25" and the first output terminal 26' is a second switch 38, in particular of a voltage-controlled type. Also the second switch 38 is, for example, a MOSFET of an n type.

For simplicity of description in what follows the first and second switches 30, 38 will be referred to, respectively, as first and second transistors 30, 38, without this implying any loss of generality.

Between the source terminal S and the drain terminal D of the first transistor 30, a first diode 32 is represented, in antiparallel configuration (with respect to the normal direction of flow of the current through the transistor 30). As is known, a characteristic of a MOSFET is that of displaying, under certain operating conditions, the electrical properties of a diode (parasitic diode). Said diode is electrically set (integrated) between the source and drain terminals of the MOSFET. In other words, the first transistor 30 can present the electrical behavior of a diode, in which the cathode of the diode corresponds to the drain terminal and the anode to the source terminal of the first transistor 30 (vice versa, in the case of p-type MOSFETs). The first diode 32 is hence the diode integrated in the first transistor 30.

Likewise, a second diode 41 is represented connected in antiparallel configuration between the source terminal S and the drain terminal D of the second transistor 38; also in this case, the second diode 41 is the diode integrated in the second transistor 38.

In greater detail, the drain terminal D of the first transistor 30 is connected to the first input terminal 25' of the rectifier circuit 24, and the source terminal S of the first transistor 30 is connected to the second output terminal 26". The drain terminal D of the second transistor 38 is connected to the first output terminal 26' of the rectifier circuit 24, and the source terminal S of the second transistor 38 is connected to the second input terminal 25". In addition, the control terminal (or gate terminal) G of the first transistor 30 is connected to the second input terminal 25" of the rectifier circuit 24 through a first resistor 34, whilst the control terminal G of the second transistor 38 is connected to a first voltage multiplier (or charge pump) 43.

The rectifier circuit 24 further comprises a third switch 31, connected between the second input terminal 25" and the second output terminal 26" of the rectifier circuit 24, and a fourth switch 36, connected between the first input terminal 25' and the first output terminal 26'.

In a way similar to what has been said for the first and second switches 30, 38, also the third and fourth switches 31, 36 are, for example, MOSFETs of an n type.

Connected in parallel to the third and fourth transistors 31, 36, and more precisely in antiparallel configuration, are a respective third diode 33 and fourth diode 40. The third and the fourth diodes 33 and 40 are the diodes integrated in the third transistor 31 and in the fourth transistor 36, respectively.

In what follows, the third and fourth switches 31 and 36 will be referred to as third and fourth transistors 31 and 36, without this implying any loss of generality.

The source terminal S and drain terminal D of the third transistor 31 are connected, respectively, to the second output terminal 26" and to the second input terminal 25" of the rectifier circuit 24; the source terminal S and drain terminal D of the fourth transistor 36 are connected, respectively, to the first input terminal 25' and to the first output terminal 26' of the rectifier circuit 24.

In addition, the control terminal (or gate terminal) G of the third transistor 31 is connected to the first input terminal 25' of the rectifier circuit 24 through a second resistor 35, whilst the control terminal G of the fourth transistor 36 is connected to a second voltage multiplier (or charge pump) 45.

As illustrated in FIG. 3, the diodes 32, 33, 40 and 41 are connected to one another to form a diode bridge of a full-wave type similar to the one illustrated in FIG. 1 (except that, in this case, the diodes are not Schottky diodes).

The fourth transistor 36 is driven in conduction and inhibition by means of a control signal $V_{ctr\_1}$ (voltage signal) generated by the first voltage multiplier 45 and applied to the gate terminal G of the fourth transistor 36; likewise, the second transistor 38 is controlled in conduction and inhibition by means of a respective control signal $V_{ctr\_2}$ (voltage signal) generated by the second voltage multiplier 45 and applied to the gate terminal G of the second transistor 38. The first voltage multiplier 43 receives at input the voltage signal $V_{IN}^+$ present on the first input terminal 25' of the rectifier circuit 24, whilst the second voltage multiplier 45 receives at input the voltage signal $V_{IN}^-$ present on the second input terminal 25" of the rectifier circuit 24. In the ultimate analysis, it is hence a portion of the input signal $V_{IN}$ that, applied appropriately to the gate terminals of the transistors 30, 31, 36, 38 (via the resistors 34, 35 and, amplifying it, via the voltage multipliers 45, 43) turns on the third and fourth transistors 31, 36 (positive values of $V_{IN}$) and the first and second transistors 30, 38 (negative values of $V_{IN}$) during an initial step of turning-on of the rectifier circuit 24 and of charging of the storage element 27.

The circuit embodiment of the rectifier circuit 24 of FIG. 3 enables reduction of the gap between the output voltage $V_{OUT}$ and the input voltage $V_{IN}$ reducing the value of the voltage $V_D$ (threshold voltage of the diodes 32, 33, and 40, 41). The value of $V_D$ can be reduced to $V_D \approx 0.1$ V. This enables values of the output voltage $V_{OUT}$ for charging the storage element 27 equal to $V_{OUT} = V_{OUT\_MIN} \approx 0.8$ V to be obtained for input voltages $V_{IN} = V_{IN\_MIN} \approx 1$ V (where $V_{IN\_MIN} \approx V_{OUT\_MIN} + 2V_D = 0.8 \text{ V} + 0.2 \text{ V}$). Hence, the storage element 27 can start to be charged (and hence to store energy) for low values of voltage $V_{IN}$ supplied by the transducer 22, in particular approximately 1 V.

Rectification of the input voltage $V_{IN}$ obtained by biasing, as described, the transistors 30, 31, 36, 38 starts when $V_{IN} \approx V_T + V_{RDSon}$. The output voltage $V_{OUT}$ starts to increase, and consequently the storage element 27 starts to store electrical charge. Here, $V_T$ is the threshold value of the first transistor 30 (or third transistor 31), and $V_{RDSon}$ is the voltage due to the source-drain resistance in the on state of the first transistor 30 (or third transistor 31). As long as $V_{IN}$ is kept higher than $V_T + V_{RDSon}$, $V_{OUT}$ evolves following $V_{IN}$ but for an offset.

What has been described is made possible by a turning-on network 37 (or pull-up network) formed by the second resistor 35 coupled to the gate terminal G of the third transistor 31, and by the first resistor 34 coupled to the gate terminal G of the first transistor 30, together with the first and second voltage multipliers 43, 45, the outputs of which, as has been said, are coupled, respectively, to the gate terminals G of the second and fourth transistors 38, 36.

In an initial turning-on step (the storage element 27 is discharged), and for positive values of input voltage $V_{IN}$, the pull-up network 37, via the second resistor 35, has, in use, the function of driving in conduction the third transistor 31 when the input voltage $V_{IN}$ exceeds (in absolute value) the threshold value $V_{T\_2}$ of the third transistor 31. The threshold value $V_{T\_2}$ is variable according to the type of transistor used, and is typically approximately 500-700 mV.

Instead, for negative values of input voltage $V_{IN}$, the pull-up network 37, via the first resistor 34, has the function of driving in conduction the first transistor 30 when the input voltage $V_{IN}$ exceeds (in absolute value) the threshold value $V_{T\_1}$ of the first transistor 30. The threshold value $V_{T\_1}$ is, for example, approximately equal to the threshold value $V_{T\_2}$.

The first and second resistors 34, 35 have a value of resistance of between approximately 10 MΩ and 100 MΩ, for example approximately 50 MΩ; the higher the resistance the less they jeopardize the efficiency of the scavenging interface.

The second and fourth transistors 38, 36 are turned on, respectively, by means of the first and second voltage multipliers (charge pumps) 43, 45. The latter are configured so as to turn on with low input voltages (for example, the turning-on voltages $V_{T\_1}$ and $V_{T\_2}$ themselves of the first and third transistors 30, 31), and generate at output a respective signal $V_{ctr\_1}$, $V_{ctr\_2}$ (voltage signal) greater than the voltage that they receive at input and such as to drive in conduction, respectively, the second transistor 38 and fourth transistor 36 (for example, $V_{ctr\_1}$ and $V_{ctr\_2}$ are equal to approximately twice the threshold voltage $V_{T\_1}$ and $V_{T\_2}$ of the transistors 30 and 31, in such a way that the voltage between the source and gate of the transistors 36 and 38 is such as to drive said transistors 36 and 38 in conduction).

Turning-on of the first voltage multipliers 43 causes corresponding biasing of the gate terminal G of the fourth transistor 36, which hence conducts and enables biasing of the storage element 27, thus charging it. Likewise, turning-on of the second voltage multiplier 45 causes the corresponding biasing of the gate terminal G of the second transistor 38, which conducts and enables charging of the storage element 27.

In this operating step, during positive half-cycles of the input voltage $V_{IN}$ (the first input terminal 25' is at positive voltage $V_{IN}^+$), the voltage rectification is made by means of the third and fourth transistors 31 and 36, which are controlled in conduction, thus by-passing the diodes 33 and 40; vice versa, during negative half-cycles of the input voltage $V_{IN}$ (the second input terminal 25" is at the negative voltage $V_{IN}^-$), the voltage rectification is made by means of the first and second transistors 30 and 38, which are controlled in conduction, thus by-passing the diodes 32 and 41.

When a minimum output voltage value $V_{OUT}$ is reached (for example, $V_{OUT}=V_{OUT\_MIN} \approx 0.8$ V), the first and second voltage multipliers 43, 45 are turned off.

Figure 4:
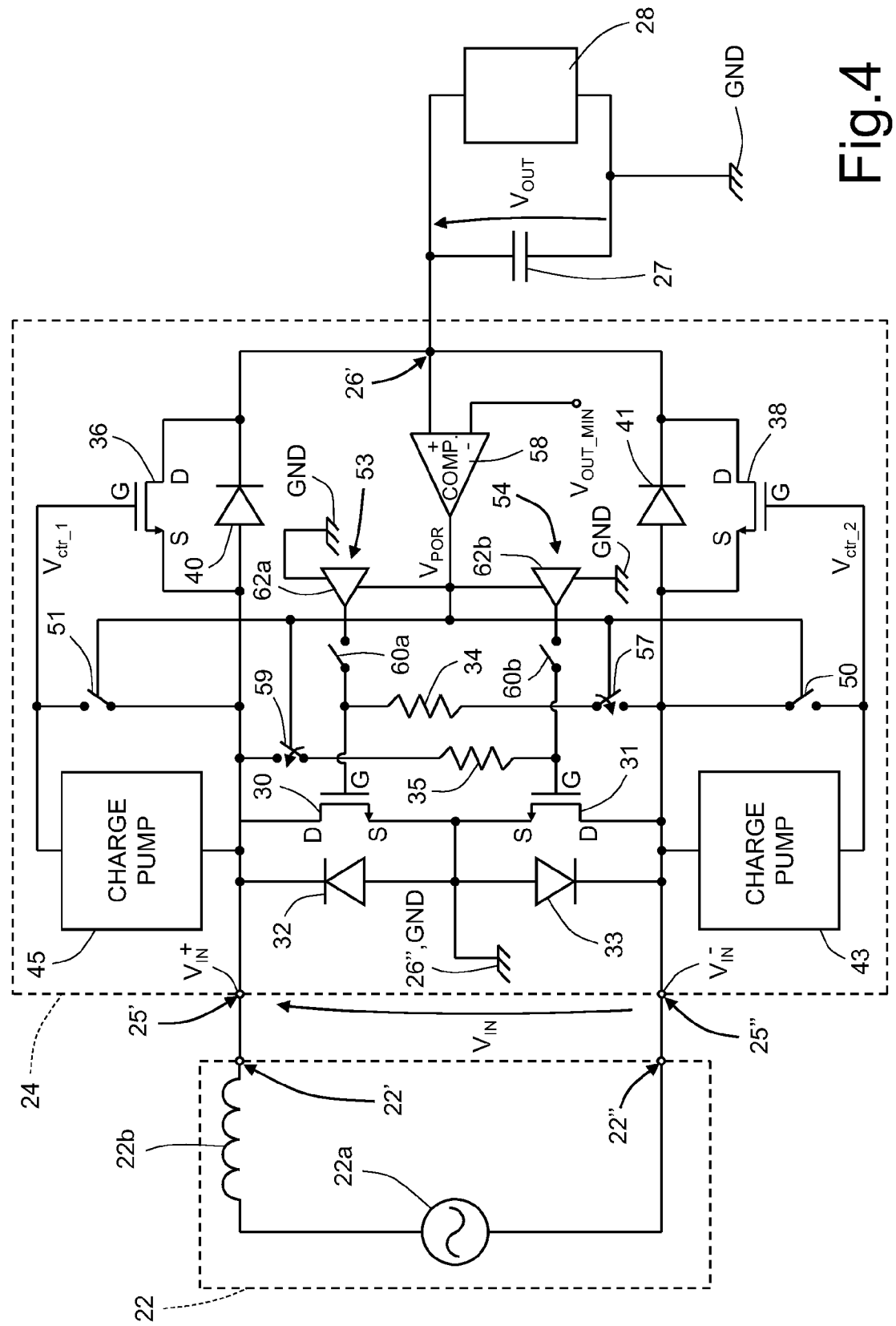
FIG. 4 shows the energy harvesting system of FIG. 3, in which the rectifier circuit comprises means for turning off the biasing means.
Figure 5:
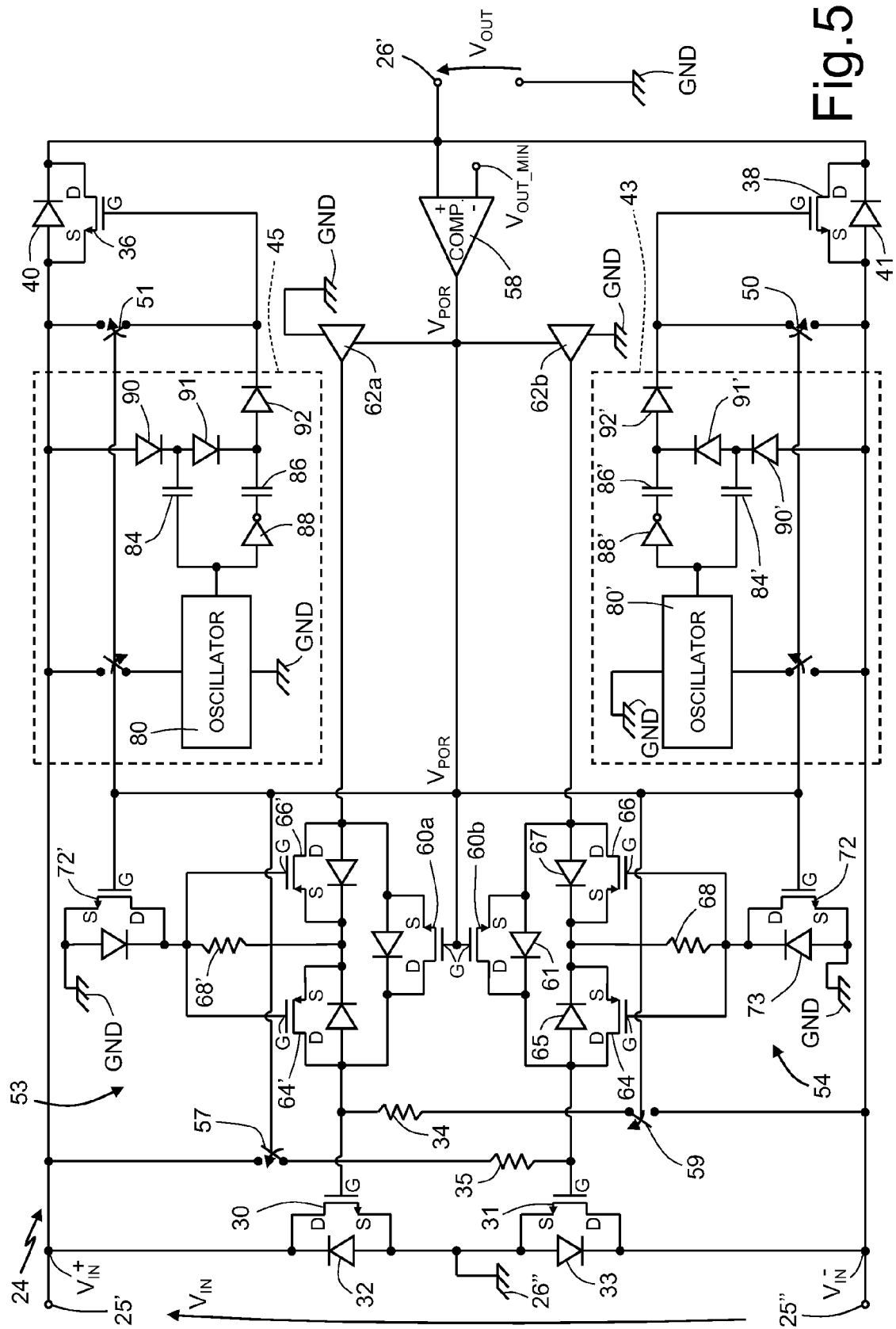
FIG. 5 shows the rectifier circuit of FIG. 4 in greater detail.

Likewise, it is expedient to disable the pull-up network comprising the first and second resistors 34, 35, decoupling the resistors 34 and 35 from the first and second input terminals 25', 25" and connecting the control terminals G of the first and third transistors 30, 31 to a respective driving device (designated in FIGS. 4 and 5 by the references 62b and 62a).

Once the desired level of output voltage $V_{OUT}$ has been reached, the rectifier circuit 24 operates in a known way.

The rectifier circuit 24, used in the step of start-up of the energy harvesting system 20, enables energy to be recovered also for small voltage values $V_{IN}$ produced by the transducer. As soon as the value of $V_{OUT}$ exceeds a minimum value (for example 0.8 V or 1 V approximately) such as to enable normal operation of similar components (for example, the driving devices 62b and 62a), the rectifier circuit 24 starts to function in an active way. The driving devices 62b and 62a manage actively the transistors 30 and 31 (in a way not described, but understood to those skilled in the art); at the same time, the transistors 36 and 38 are turned off, and just the integrated diodes 40, 41 are used.

The transistors 31 and 30 are kept closed for a time proportional to the time constant L/R of the transducer 22 so as to be able to store sufficient energy in the inductor proper to the scavenging interface. At the end of the pre-set time, the transistor 30 (or alternatively 31 according to the polarity of the current stored) is turned off and the current stored is transferred at output on the storage element 27 by means of the diodes 40 and 41, causing an increase in the voltage $V_{OUT}$. When the current in the diodes goes to zero the operation is repeated.

FIG. 4 shows the system of FIG. 3 comprising further electronic components designed to disable, when necessary, the first and second voltage multipliers 43, 45 and to uncouple the control terminal G of the first and third switches 30, 31 from the input terminals 25', 25".

In order to disable the first and second voltage multipliers 43, 45, a first by-pass switch and a second by-pass switch 50, 51 are connected in parallel, respectively, to the first and second voltage multipliers 43, 45. In order to drive the first and third transistors 30, 31 appropriately, a respective first and second driving circuits 53, 54 are connected to the control terminal (gate terminal G) of the first transistor 30 and third transistor 31, respectively. The first driving circuit 53 comprises a driving device 62a connected in series to a switch 60a; the second driving circuit 54 comprises a driving device 62b connected in series to a switch 60b. In addition, the first and second driving circuits 53, 54 comprise, respectively, a switch 57 connected in series to the first resistor 34, and a switch 59 connected in series to the second resistor 35. In the initial step of turning-on of the rectifier circuit 24, where it is necessary to drive in conduction the first and third transistors 30, 31, the switches 60b and 60a are open (they form, that is, a high-impedance terminal), and the resistors 34 and 35 are coupled to the input terminals 25', 25" by means of the switches 57 and 59, which are closed. Instead, when it is necessary to disable the biasing network of the first and third transistors 30, 31, the first and second driving circuits 53, 54 are configured so as to connect the gate terminal G of the first and third transistors 30, 31 to respective driving devices 62b and 62a (of a known type and not described in detail herein), thus closing the switches 60b and 60a. After turning-on of the rectifier circuit 24 (when $V_{OUT} > V_{OUT\_MIN}$), the driving devices 62b and 62a drive the transistors 30 and 31 according to a logic not forming part of the present invention, for operating the rectifier circuit 24 in order to generate at output a rectified signal $V_{OUT}$.

The first and second driving circuits 53, 54 and the first and second by-pass switches 50, 51 are controlled in operation (in conduction and inhibition) by an enabling signal $V_{POR}$ ("power-on reset" signal). The enabling signal $V_{POR}$ is generated, for example, by a comparator 58, which receives at input the output signal $V_{OUT}$ and a reference signal having a value $V_{OUT\_MIN}$, and generates at output the enabling signal $V_{POR}$, which assumes a first value $V_{POR}^+$ if the output signal $V_{OUT}$ is higher than $V_{OUT\_MIN}$, and a second value $V_{POR}^-$ if the output signal $V_{OUT}$ is lower than $V_{OUT\_MIN}$.

For example, $V_{POR}^+$ is equal to $V_{DD}$, whilst $V_{POR}^-$ is equal to the reference voltage GND. The voltage $V_{DD}$, for example, can be generated by means of a linear regulator connected to $V_{OUT}$, and, for example, is equal to 2.5 V (in steady-state conditions).

When $V_{POR}=V_{POR}^-$ (condition given by $V_{OUT} < V_{OUT\_MIN}$), the first and second driving circuits 53, 54 are controlled so as to connect the control terminals G of the first and third transistors 30, 31 to a high-impedance terminal (the switches 60b, 60a are open) and so as to close the switches 57 and 59. Thus, biasing of the control terminals G of the first and third transistors 30, 31 is obtained via the input voltage $V_{IN}$ by means of the resistors 34, 35. The first and second by-pass switches 50, 51 are open, and the charge pumps 45, 43 operate as described previously.

When $V_{POR}=V_{POR}^+$ (condition given by $V_{OUT} \leq V_{OUT\_MIN}$), the switches 57 and 59 are opened and the switches 60*b*, 60*a* are closed, thus decoupling the first and second resistors 34, 35 from the input terminals 25' and 25" and coupling the gate terminals G of the first and third transistors 30, 31 to the driving devices 62*a*, 62*b*. Moreover, the first and second by-pass switches 50, 51 are closed, enabling turning-off of the voltage multipliers 43, 45.

According to one embodiment of the present invention, the switches 50, 51, 57 and 59 are p-channel MOSFETs. The switches 60*b*, 60*a* are p-channel MOSFETs in "back-to-back" configuration set in parallel to an n-channel transistor. Consequently, the signals $V_{POR}^+$ and $V_{POR}^-$ are signals designed to drive in conduction/inhibition n and p MOSFETs.

FIG. 5 shows the rectifier circuit 24 in which the voltage multipliers 43, 45, and the first and second driving circuits 53, 54 are illustrated in greater detail, according to one embodiment of the present invention.

The first and second driving circuits 53 and 54 are the same as one another; likewise, also the first and second voltage multipliers 43, 45 are the same as one another.

The second driving circuit 54 comprises the switch 60*b*, for example a MOSFET of an n type (with integrated antiparallel diode 61), controlled in opening and closing by the signal $V_{POR}$ and connected between the gate terminal G of the third transistor 31 and the driving device 62*b*.

In use, when $V_{POR}=V_{POR}^-$, the transistor 60*b* is inhibited, and the gate terminal G of the third transistor 31 is connected to high impedance. The gate G of the third transistor 31 is consequently biased, as described, by the portion of the input signal $V_{IN}$ brought onto the gate G by means of the second resistor 35. When $V_{POR}=V_{POR}^+$, the transistor 60*b* is closed, and the gate G of the third transistor 31 is driven by the signal generated at output by the driving device 62*b* (as has been said, in order to generate at output a rectified signal, in a known way and not forming part of the present invention).

Since the transistor 60*b* is not an ideal switch, to improve the performance of the second driving circuit 54, the latter comprises further components designed to limit leakage currents. In particular, the second driving circuit 54 comprises transistors 64, 66, for example p-type MOSFETs (with integrated antiparallel diodes 65 and 67), having the source terminals S connected to one another, and the respective drain terminals D connected to the drain terminal and source terminal, respectively, of the transistor 60*b*. Moreover, the gate terminals G of the transistors 64, 66 are connected to one another, and are connected to the respective source terminals S via a resistor 68.

Finally, a transistor 72 (with integrated antiparallel diode 73), for example a MOSFET of an n type, connects the gate terminal of the transistors 64 and 66 to a ground terminal GND.

When $V_{POR}=V_{POR}^-$, the transistor 72 is inhibited, and the gate and source terminals of the transistors 64 and 66 are at one and the same potential, thus guaranteeing their inhibition. The internal source node (common to the transistors 64 and 66, respectively, 64' and 66') is biased through the voltage $V_{IN}$, which simultaneously biases, by means of the resistors 34 and 35, the gate terminal of the transistors 30 and 31 and, by means of the body diodes 65 and 67, the transistors 64, 66, 64', 66'. The transistor 60*b*, of an n type, is instead turned off.

When $V_{POR}=V_{POR}^+$, the transistors 60*b* and 72 are turned on, whereas the switch 57 is open. In this configuration, the gate terminal of the transistors 64 and 66 is connected to the reference voltage GND, and the source terminal is connected to the output node of the driving device 62*b*. The gate terminal of the transistor 31 is thus connected to the driving circuit 62*b*.

The respective values of $V_{POR}^-$ and $V_{POR}^+$ are consequently chosen in such a way as to control the switches/transistors 57, 59, 60*b*, 64, 66, and 72 in opening and closing according to what has been described.

As has been said, the first biasing circuit 53 is similar to the second biasing circuit 54 and consequently is not described further herein.

With reference to the second voltage multiplier 45, the latter comprises a loop oscillator 80 (of a known type, for example including a chain of inverters), that can be connected via a switch 82, for example a p-type MOSFET, to the first input terminal 25'. The loop oscillator 80 receives at input the signal present on the first input terminal 25' and generates at output a signal oscillating between a high signal value and a low signal value.

The loop oscillator 80 is configured for turning on and generating an output signal with low input voltages, for example the typical voltages of turning-on of the third transistor 31 (for instance, approximately 500-700 mV). The output of the loop oscillator 80 charges a first capacitor 84 and a second capacitor 86. Since the output signal of the loop oscillator 80 varies between positive values and negative values, an inverter 88 is connected between the output of the loop oscillator 80 and the second capacitor 86.

In this way, during each half-period of the signal at output from the loop oscillator 80 at least one between the first capacitor 84 and the second capacitor 86 is charged. The diodes 90, 91, 92, have the function of transferring the charge stored on the capacitors 84 and 86 to the intermediate nodes to be able to bias the gate terminal of the transistor 36 correctly.

After some clock cycles of the loop oscillator 80, the voltage at output from the first and second capacitors 84, 86 (which biases the gate terminal G of the fourth transistor 36) is higher than the voltage present on the source terminal of the fourth transistor 36 (for example, twice the latter), and the fourth transistor 36 turns on.

The first voltage multiplier 43 is similar to the second voltage multiplier 45, and operates in a way similar to the second voltage multiplier 45. The first voltage multiplier 43 is consequently not described further.

Figure 6:
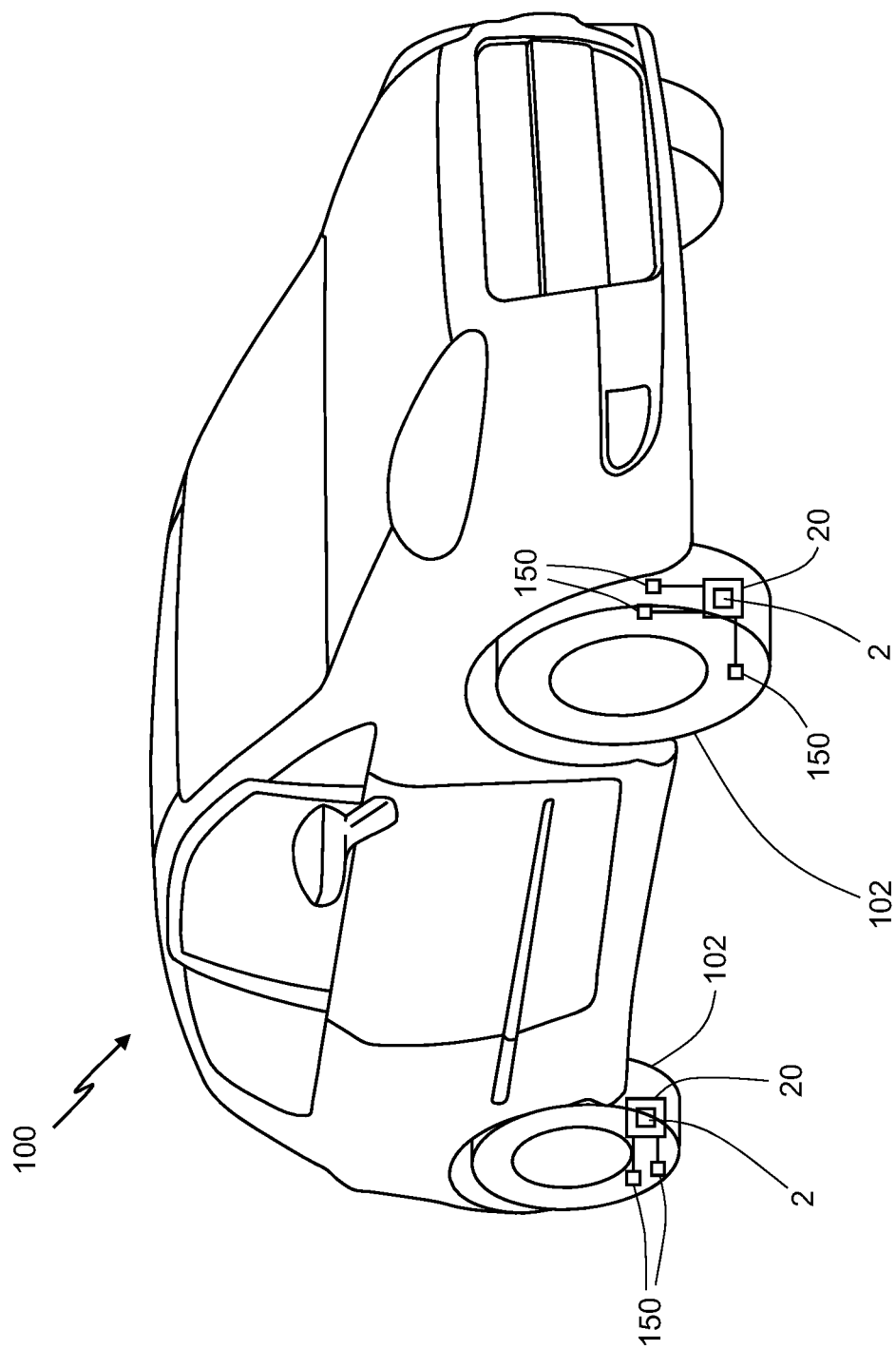
FIG. 6 shows a vehicle comprising the energy harvesting system of FIG. 3 or FIG. 4.

FIG. 6 shows a vehicle 100 comprising the energy harvesting system 20, according to one embodiment of the present invention. The vehicle 100 is, in particular, a motor vehicle. It is evident, however, that the energy harvesting system 20 can be used in any vehicle 100 or in systems or apparatuses other than a vehicle. In particular, the energy harvesting system 20 can find application in generic systems in which it is desirable to harvest, store, and use environmental energy, in particular by means of conversion of mechanical energy into electrical energy.

With reference to FIG. 6, the vehicle 100 comprises one or more transducers 2 coupled in a known way to a portion of the vehicle 100 subjected to mechanical stresses and/or vibrations, for converting said mechanical stresses and/or vibrations into electric current. The energy harvesting system 20 is connected to one or more electrical loads 28*a* . . . 28*n*, for example via interposition of a DC-DC converter. In particular, according to an application of the present invention, the electrical loads 28*a* . . . 28*n* comprise TPM (tire-parameter monitoring) sensors 150 for monitoring parameters of tires 102. In this case, the TPM sensors 150 are coupled to an internal portion of the tires 102 of the vehicle 100. Likewise, also the transducers 2 (for example, of an electromagnetic or piezoelectric type) are coupled to an internal portion of the tires 102. The stress of the transducers 2 when the vehicle 100 is travelling causes production of a current/voltage electrical signal at output from the transducer 2 by means of conversion of the mechanical energy into electrical energy. The electrical energy thus produced is stored, as described previously, in the storage element 27 and supplied, via the DC-DC converter that may be present, to the TPM sensors 50. Thanks to the fact that the rectifier circuit 24 is configured for turning on and supplying an output signal for charging the storage element 27 also with low input voltages, the storage element 27 is charged also at low travelling speeds of the vehicle 100. For example, using a transducer of an electromagnetic type, the storage element is charged starting from speeds lower than 40 km/h.

According to one embodiment of the present invention, the energy harvesting system 20, comprising one or more transducers, and the TPM sensors 150, are glued inside one or more tires 102. The impact of the tire 102 on the ground during motion of the vehicle 100 enables production of electrical energy.

As an alternative to what is illustrated in FIG. 6, the energy harvesting system 20, can be set in any other portion of the vehicle 100, and/or used for supplying an electrical load other than or additional to the TPM sensors 150.

Another possible application of the energy harvesting system 20 is the generation of electrical energy by exploiting the mechanical energy produced by an individual when he is walking or running. In this case, the energy harvesting system 10 is located inside the shoes of said individual (for example, inside the sole). In systems aimed at fitness, where it is particularly interesting to count the steps, it is useful to recover energy from the vibrations induced by walking/running to be able to supply without the use of a battery acceleration sensors and/or RFID transmitters capable of communicating with cellphones, devices for playing music, or with any other apparatus involved in information on the steps performed.

From an examination of the characteristics of the rectifier circuit obtained according to the present disclosure the advantages that it affords are evident.

In particular, the rectifier circuit is of a completely integrated type and is configured for turning on, without the aid of active electronic components, external to the rectifier circuit itself, which would cause a further dispersion of energy.

Furthermore, the rectifier circuit is able to generate an output signal for low values of the input signal (in particular, equal to the threshold value of a transistor). When integrated in an energy harvesting system, for example on board a vehicle, the rectifier circuit according to the present invention is able to generate an output signal for low values of input signal (i.e., for low vehicle speeds, as described previously). A further advantage that is obtained lies in the possibility of being able to produce transducers of smaller size as compared to known transducers (which consequently generate lower voltages), at the same time guaranteeing the energy harvesting capacity. Transducers of smaller size can be integrated more easily.

Finally, it is clear that modifications and variations may be made to what has been described and illustrated herein, without thereby departing from the sphere of protection of the present invention, as defined in the annexed claims.

In particular, according to one embodiment, the rectifier circuit 24 can comprise a number of diodes different from what has been described.

For instance, the rectifier circuit 24 can be a half-wave rectifier, comprising only two diodes (for example, just the first and fourth diodes 30, 38, or else just the second and third diodes 31, 36). Use of a half-wave rectifier can be advantageous in the case where the input signal $V_{IN}$ is of a known type and comprises only positive (or negative) half-waves. Its use is, however, not recommended (albeit possible) in energy harvesting systems in so far as part of the input signal would be lost, at the expense of the efficiency of the system as a whole.

Furthermore, there may be present a plurality of transducers 2, all of the same type or of types different from one another, indifferently. For example, the transducer/transducers can be chosen in the group comprising: electrochemical transducers (designed to convert chemical energy into an electrical signal), electromechanical transducers (designed to convert mechanical energy into an electrical signal), electroacoustic transducers (designed to convert variations of pressure into an electrical signal), electromagnetic transducers (designed to convert a magnetic field into an electrical signal), photoelectric transducers (designed to convert light energy into an electrical signal), electrostatic transducers, or thermoelectrical transducers.

What is claimed is:

1. A rectifier circuit, comprising:
    a first and a second diode electrically connected to one another to form a diode rectifier;
    a first and a second switch connected in parallel, respectively, to the first and second diodes; and
    a first biasing network coupled to control terminals of the first and second switches and configured to close, during a step of turning-on of the rectifier circuit, the first and second switches by generating a first turning-on signal which is a function of an input signal so as to generate at an output a rectified output signal;
    wherein the first biasing network comprises:
        a first charge pump connected to the control terminal of the second switch and configured to receive at an input the first turning-on signal and generate at an output a first intermediate signal that is adapted to close the second switch; and
        a first resistive element connected to the control terminal of the first switch and configured for biasing, by the first turning-on signal, the control terminal of the first switch.

2. The rectifier circuit according to claim 1, wherein the first biasing network further comprises a first turning-off circuit coupled to the control terminal of the first switch and to the first charge pump and configured to disable the first biasing network when the output signal exceeds a predetermined threshold value.

3. A The rectifier circuit, comprising:
    a first and a second diode electrically connected to one another to form a diode rectifier;
    a first and a second switch connected in parallel, respectively, to the first and second diode; and
    a first biasing network coupled to control terminals of the first and second switches and configured to close, during a step of turning-on of the rectifier circuit, the first and second switches by generating a first turning-on signal which is a function of an AC input signal so as to generate at an output a rectified DC output signal; wherein the input signal is an AC signal, and
    further comprising:
        a third diode and a fourth diode electrically coupled to the first and second diodes so as to form a full-wave diode-bridge rectifier;
        a third switch and a fourth switch connected in parallel, respectively, to the third and fourth diodes; and
        a second biasing network coupled to control terminals of the third and fourth switches and configured to close, during a step of turning-on of the rectifier circuit, the third and fourth switches by generating a second turning-on signal which is a function of the input signal so as to generate at the output the rectified DC output signal.

4. The rectifier circuit according to claim 3, wherein the first biasing network is configured to close the first and second switches during a negative half-wave of the AC input signal, and the second biasing network is configured to close the third and fourth switches during a positive half-wave of the AC input signal.

5. The rectifier circuit according to claim 3, wherein the second biasing network comprises:
a second charge pump connected to the control terminal of the fourth switch and configured to receive at an input the second turning-on signal and generate at an output a second intermediate signal that is adapted to close the fourth switch; and
a second resistive element connected to the control terminal of the second switch and configured to bias, by the second turning-on signal, the control terminal of the second switch.

6. The rectifier circuit according to claim 5, wherein the second biasing network further comprises a second turning-off circuit coupled to the control terminal of the third switch and to the second charge pump and configured to disable the second biasing network when the output signal exceeds the predetermined threshold value.

7. The rectifier circuit according to claim 5, wherein the first charge pump comprises:
an oscillator configured to receive at an input a signal that is a function of the AC input signal and generate at an output a voltage signal; and
at least one capacitor coupled to an output of the oscillator and configured to receive at the input the voltage signal generated by the oscillator.

8. An energy-harvesting system, comprising:
a transducer configured to convert energy coming from an energy source into an AC electrical signal;
a rectifier circuit configured to receive the AC electrical signal and supply a DC output signal;
a first storage element coupled to the rectifier circuit and configured to receive the DC output signal and store electrical energy;
wherein the rectifier circuit comprises:
a first and a second diode electrically connected to one another to form a diode rectifier;
a first and a second switch connected in parallel, respectively, to the first and second diodes; and
a first biasing network coupled to control terminals of the first and second switches and configured to close, during a step of turning-on of the rectifier circuit, the first and second switches by generating a first turning-on signal which is a function of the AC electrical signal so as to generate at an output the DC output signal.

9. The system according to claim 8, further comprising a DC-DC converter connected between the rectifier circuit and an electrical load, said DC-DC converter configured to receive the DC output signal and supply the electrical load via a signal that is a function of the DC output signal.

10. The system according to claim 8, wherein the first biasing network comprises:
a first charge pump connected to the control terminal of the second switch and configured to receive at an input the first turning-on signal and generate at an output a first intermediate signal that is adapted to close the second switch; and
a first resistive element connected to the control terminal of the first switch and configured for biasing, by the first turning-on signal, the control terminal of the first switch.

11. The system according to claim 10, wherein the first biasing network further comprises a first turning-off circuit coupled to the control terminal of the first switch and to the first charge pump and configured to disable the first biasing network when the DC output signal exceeds a predetermined threshold value.

12. The system according to claim 8, further comprising:
a third diode and a fourth diode electrically coupled to the first and second diodes so as to form a full-wave diode-bridge rectifier;
a third switch and a fourth switch connected in parallel, respectively, to the third and fourth diodes; and
a second biasing network coupled to control terminals of the third and fourth switches and configured to close, during a step of turning-on of the rectifier circuit, the third and fourth switches by generating a second turning-on signal which is a function of the AC electrical input signal so as to generate at the output the rectified DC output signal.

13. An apparatus, comprising:
a vehicle including an energy-harvesting system, wherein the energy harvesting system comprises:
a transducer configured to convert energy coming from an energy source into an AC electrical signal;
a rectifier circuit configured to receive the AC electrical signal and supply a DC output signal;
a first storage element coupled to the rectifier circuit and configured to receive the DC output signal and store electrical energy;
wherein the rectifier circuit comprises:
a first and a second diode electrically connected to one another to form a diode rectifier;
a first and a second switch connected in parallel, respectively, to the first and second diodes; and
a first biasing network coupled to control terminals of the first and second switches and configured to close, during a step of turning-on of the rectifier circuit, the first and second switches by generating a first turning-on signal which is a function of the AC electrical signal so as to generate at an output the DC output signal.

14. The apparatus according to claim 13, wherein said transducer is chosen in the group comprising: electrochemical transducer, electromechanical transducer, electroacoustic transducer, electromagnetic transducer, photoelectric transducer, electrostatic transducer, thermoelectrical transducer.

15. The apparatus according to claim 13, further comprising a DC-DC converter connected between the rectifier circuit and an electrical load, said DC-DC converter configured to receive the DC output signal and supply the electrical load via a signal that is a function of the DC output signal.

16. The apparatus according to claim 13, wherein the first biasing network comprises:
a first charge pump connected to the control terminal of the second switch and configured to receive at an input the first turning-on signal and generate at an output a first intermediate signal that is adapted to close the second switch; and
a first resistive element connected to the control terminal of the first switch and configured for biasing, by the first turning-on signal, the control terminal of the first switch.

17. The apparatus according to claim 16, wherein the first biasing network further comprises a first turning-off circuit coupled to the control terminal of the first switch and to the first charge pump and configured to disable the first biasing network when the DC output signal exceeds a predetermined threshold value.

18. The apparatus according to claim 13, further comprising:
- a third diode and a fourth diode electrically coupled to the first and second diodes so as to form a full-wave diode-bridge rectifier;
- a third switch and a fourth switch connected in parallel, respectively, to the third and fourth diodes; and
- a second biasing network coupled to control terminals of the third and fourth switches and configured to close, during a step of turning-on of the rectifier circuit, the third and fourth switches by generating a second turning-on signal which is a function of the AC electrical input signal so as to generate at the output the rectified DC output signal.

19. A circuit, comprising:
- a first and second input node configured to receive a AC source;
- a first transistor coupled between the first input node and a reference node and having a first control terminal coupled through a first biasing resistance to the second input node;
- a second transistor coupled between the second input node and the reference node and having a second control terminal coupled through a second biasing resistance to the first input node;
- a third transistor coupled between the first input node and an output node and having a third control terminal;
- a fourth transistor coupled between the second input node and the output node and having a fourth control terminal;
- a first charge pump circuit having a supply input coupled to the first input node and configured to generate a first control signal for application to the third control terminal of the third transistor; and
- a second charge pump circuit having a supply input coupled to the second input node and configured to generate a second control signal for application to the fourth control terminal of the fourth transistor.

20. The circuit of claim 19, further comprising: a first switch in series with the first biasing resistance and configured to selectively couple the first control terminal to the second input node; and a second switch in series with the second biasing resistance and configured to selectively couple the second control terminal to the first input node.

21. The circuit of claim 20, further comprising a comparator circuit having an input configured to sense a voltage at the output node for comparison to a threshold, and having an output configured to supply a control signal that actuates the first and second switches.

22. The circuit of claim 20, further comprising:
- a third switch configured to selectively couple the third control terminal to the first input node; and
- a fourth switch configured to selectively couple the fourth control terminal to the first input node.

23. The circuit of claim 22, further comprising a comparator circuit having an input configured to sense a voltage at the output node for comparison to a threshold, and having an output configured to supply a control signal that actuates the third and fourth switches.

24. The rectifier circuit according to claim 1, further comprising:
- a third diode and a fourth diode electrically coupled to the first and second diodes so as to form a full-wave diode-bridge rectifier;
- a third switch and a fourth switch connected in parallel, respectively, to the third and fourth diodes; and
- a second biasing network coupled to control terminals of the third and fourth switches and configured to close, during a step of turning-on of the rectifier circuit, the third and fourth switches by generating a second turning-on signal which is a function of the input signal so as to generate at the output the rectified output signal.

25. The rectifier circuit according to claim 24, wherein the first biasing network is configured to close the first and second switches during a negative half-wave of the input signal, and the second biasing network is configured to close the third and fourth switches during a positive half-wave of the input signal.

26. The rectifier circuit according to claim 24, wherein the second biasing network comprises:
- a second charge pump connected to the control terminal of the fourth switch and configured to receive at an input the second turning-on signal and generate at an output a second intermediate signal that is adapted to close the fourth switch; and
- a second resistive element connected to the control terminal of the second switch and configured to bias, by the second turning-on signal, the control terminal of the second switch.

27. The rectifier circuit according to claim 26, wherein the second biasing network further comprises a second turning-off circuit coupled to the control terminal of the third switch and to the second charge pump and configured to disable the second biasing network when the output signal exceeds the predetermined threshold value.

28. The rectifier circuit according to claim 26, wherein the first charge pump comprises:
- an oscillator configured to receive at an input a signal that is a function of the AC input signal and generate at an output a voltage signal; and
- at least one capacitor coupled to an output of the oscillator and configured to receive at the input the voltage signal generated by the oscillator.

* * * * *

UNITED STATES PATENT AND TRADEMARK OFFICE
CERTIFICATE OF CORRECTION

PATENT NO.       : 9,160,223 B2
APPLICATION NO.  : 13/456725
DATED            : October 13, 2015
INVENTOR(S)      : Giorgio Massimiliano Membretti et al.

Page 1 of 1

It is certified that error appears in the above-identified patent and that said Letters Patent is hereby corrected as shown below:

In the Claims:

At column 12, claim number 3, line number 46, delete the first word "A".

At column 12, claim number 3, line numbers 56-57, delete the phrase "wherein the input signal is an AC signal,".

At column 14, claim number 12, line number 21, delete "input" and "rectified".

At column 15, claim number 18, line number 16, delete "input" and "rectified".

Signed and Sealed this
First Day of March, 2016

Michelle K. Lee
*Director of the United States Patent and Trademark Office*